United States Patent
Kuo et al.

(10) Patent No.: US 8,173,462 B2
(45) Date of Patent: May 8, 2012

(54) MANUFACTURING METHOD OF NITRIDE CRYSTALLINE FILM, NITRIDE FILM AND SUBSTRATE STRUCTURE

(75) Inventors: Cheng-Huang Kuo, Tainan County (TW); Chi-Wen Kuo, Tainan County (TW); Chun-Ju Tun, Taoyuan County (TW)

(73) Assignee: National Central University, Taoyuan (TW)

( * ) Notice: Subject to any disclaimer, the term of this patent is extended or adjusted under 35 U.S.C. 154(b) by 518 days.

(21) Appl. No.: 12/399,036

(22) Filed: Mar. 6, 2009

(65) Prior Publication Data

US 2010/0119845 A1    May 13, 2010

(30) Foreign Application Priority Data

Nov. 10, 2008   (TW) ................. 97143404 A

(51) Int. Cl.
*H01L 21/306* (2006.01)
*H01L 21/465* (2006.01)

(52) U.S. Cl. .......... 438/44; 438/498; 438/504; 438/704; 438/734; 438/749; 257/E21.221

(58) Field of Classification Search ............ 438/44, 438/504, 798, 704, 734, 749; 257/E21.221
See application file for complete search history.

(56) References Cited

U.S. PATENT DOCUMENTS

| | | | | |
|---|---|---|---|---|
| 5,573,973 A * | 11/1996 | Sethi et al. | ............... | 438/386 |
| 6,261,929 B1 * | 7/2001 | Gehrke et al. | ............... | 438/478 |
| 6,265,289 B1 * | 7/2001 | Zheleva et al. | ............... | 438/503 |
| 6,447,604 B1 * | 9/2002 | Flynn et al. | ............... | 117/89 |
| 6,623,560 B2 * | 9/2003 | Biwa et al. | ............... | 117/95 |
| 7,338,828 B2 * | 3/2008 | Imer et al. | ............... | 438/46 |
| 7,361,576 B2 * | 4/2008 | Imer et al. | ............... | 438/479 |
| 7,605,527 B2 * | 10/2009 | Sakai et al. | ............... | 313/311 |
| 7,892,489 B2 * | 2/2011 | Wang et al. | ............... | 422/402 |
| 7,935,615 B2 * | 5/2011 | Shibata | ............... | 438/481 |
| 7,955,983 B2 * | 6/2011 | Imer et al. | ............... | 438/698 |

(Continued)

FOREIGN PATENT DOCUMENTS

WO    WO 2008087452 A1 *    7/2008

OTHER PUBLICATIONS

Deb et al., Facted and Vertically Aligned GaN Nanorod Arrays Fabricated without Catalysts or Lithography, Nano Letters, vol. 5, No. 9, 2005, pp. 1847-1851.*

(Continued)

*Primary Examiner* — David Vu
*Assistant Examiner* — Earl Taylor
(74) *Attorney, Agent, or Firm* — Jianq Chyun IP Office

(57) ABSTRACT

A manufacturing method of a nitride crystalline film includes following steps. First, a substrate is provided. Next, a first nitride crystalline film is formed on the substrate. A patterned mask is then formed on the first nitride crystalline film. The patterned mask covers a first part of the first nitride crystalline film and exposes a second part of the first nitride crystalline film. Afterwards, the second part is etched, and the first part is maintained. After that, the patterned mask is removed. The first part is then etched to form a plurality of nitride crystal nuclei. Next, a second nitride crystalline film is formed on the substrate, and the second nitride crystalline film is made to cover the nitride crystal nuclei. A nitride film and a substrate structure are also provided.

9 Claims, 12 Drawing Sheets

U.S. PATENT DOCUMENTS

| | | | | |
|---|---|---|---|---|
| 7,985,637 | B2* | 7/2011 | Okamoto | 438/167 |
| 2002/0111044 | A1* | 8/2002 | Linthicum et al. | 438/797 |
| 2002/0127856 | A1* | 9/2002 | Kunisato et al. | 438/689 |
| 2003/0080345 | A1* | 5/2003 | Motoki et al. | 257/103 |
| 2003/0114017 | A1* | 6/2003 | Wong et al. | 438/778 |
| 2005/0264157 | A1* | 12/2005 | Sakai et al. | 313/311 |
| 2005/0285132 | A1* | 12/2005 | Orita | 257/99 |
| 2006/0270076 | A1* | 11/2006 | Imer et al. | 438/22 |
| 2007/0015345 | A1* | 1/2007 | Baker et al. | 438/481 |
| 2007/0108466 | A1* | 5/2007 | Kryliouk et al. | 257/103 |
| 2008/0026502 | A1* | 1/2008 | Imer et al. | 438/46 |
| 2008/0185690 | A1* | 8/2008 | Imer et al. | 257/622 |
| 2008/0246076 | A1* | 10/2008 | Chen | 257/316 |
| 2008/0277682 | A1* | 11/2008 | Mishra et al. | 257/98 |
| 2009/0079034 | A1* | 3/2009 | Wang | 257/615 |
| 2009/0090930 | A1* | 4/2009 | Chen et al. | 257/103 |
| 2009/0174038 | A1* | 7/2009 | Wang | 257/618 |
| 2010/0029064 | A1* | 2/2010 | Kryliouk et al. | 438/478 |
| 2010/0119845 | A1* | 5/2010 | Kuo et al. | 428/426 |

OTHER PUBLICATIONS

Ng et al., Nanstructures on GaN by Microsphere Lithography, Microscopy of Semiconducting Materials 2007, Springer Proceedings in Physics, vol. 120, No. 1, 2008, pp. 81-84.*

Hsueh et al., Characterization of InGaN/GaN Multiple Quantum Well Nanorods Fabricated by Plasma Etching with Self-Assembled Nickel Metal Nanomasks, Japanese Journal of Applied Physics, vol. 44, No. 4B, 2005, pp. 2661-2663.*

Hung et al., Self-formation of GaN hollow nanocolumns by inductively coupled plasma etching, Applied Physics A Materials Science & Processing, 80, 2005, pp. 1607-1610.*

Huang et al., Fabrication of GaN-based nanorod light emitting diodes using self-assemble nickel nano-mask and inductively coupled plasma reactive ion etching, Materials Science and Engineering B, 113, 2004, pp. 125-129.*

Hsieh et al., InGaN-GaN Nanorod Light Emitting Arrays Fabricated by Silica Nanomasks, IEEE Journal of Quantum Electronics, vol. 44, No. 5, 2008, pp. 468-472.*

Hsu et al., Generally Applicable Self-Masked Dry Etching Technique for Nanotip Array Fabrication, Nano Letters, vol. 4, No. 3, 2004, pp. 471-475.*

Gao et al., Roughening Hexagonal Surface Morphology on Laser Lift-Off (LLO) N-Face GaN with Simple Photo-Enhanced Chemical Wet Etching, Japanese Journal of Applied Physics, vol. 43, No. 5A, 2004, pp. 637-639.*

Hsieh et al, Improvement of External Extraction Efficiency in GaN-Based LEDs by SiO2 Nanosphere Lithography, IEEE Electron Device Letters, vol. 29, No. 7, 2008, pp. 658-660.*

Lin et al., Fabrication InGaN Nanodisk Structure in GaN Reverse Hexagonal Pyramid, Japanese Journal of Applied Physics, vol. 45, No. 4B, 2006, pp. 3818-3821.*

Article Titled "High Quality GaN Grown from a Nonoporous GaN Template" jointly authored by Hartono et al., in Journal of The Electrochemical Society, 2007 (pp. H1004-H1007).

Article Titled "Dislocation annihilation in regrown GaN on nanoporous GaN template with optimization of buffer layer growth" jointly authored by Soh et al., in Applied Physics Letters 90, 2007 (pp. 053112).

* cited by examiner

MANUFACTURING METHOD OF NITRIDE CRYSTALLINE FILM, NITRIDE FILM AND SUBSTRATE STRUCTURE

CROSS-REFERENCE TO RELATED APPLICATION

This application claims the priority benefit of Taiwan application serial no. 97143404, filed Nov. 10, 2008. The entirety of the above-mentioned patent application is hereby incorporated by reference herein and made a part of specification.

BACKGROUND OF THE INVENTION

1. Field of the Invention

The present invention relates to a film, a manufacturing method thereof, and a substrate structure including the film. More specifically, the present invention relates to a manufacturing method of a nitride crystalline film, a nitride film, and a substrate structure including the nitride film.

2. Description of Related Art

With the development of electronic technology, the thin film deposition technique has been widely used in the manufacture of electronic devices. The thin film deposition is mainly categorized into two groups, physical vapor deposition (PVD) and chemical vapor deposition (CVD), where the former is mainly applied in deposition of metal materials, and the application scope of the latter includes deposition of dielectric materials, conductive materials, and semiconductor materials. The technique of semiconductor thin film deposition can be utilized in the manufacture of light emitting diode (LED). Moreover, the quality of semiconductor thin film deposition directly affects the optoelectronic property, the reliability, and the lifetime of an LED chip.

FIG. 1 is a schematic view of a conventional LED chip. Referring to FIG. 1, sequentially from bottom to top, the conventional LED chip 100 includes a sapphire substrate 110, a buffer layer 120, an undoped gallium nitride epitaxial layer 130, an N-type gallium nitride epitaxial layer 140, a light emitting layer 150, and a P-type gallium nitride epitaxial layer 160. In addition, a positive electrode 172 is disposed on the P-type gallium nitride epitaxial layer 160, and a negative electrode 170 is disposed on the N-type gallium nitride epitaxial layer 140. Since the lattice constants of the gallium nitride lattice and the sapphire lattice do not match, in order for the N-type gallium nitride epitaxial layer 140 to obtain a stable lattice structure, the buffer layer 120 is formed on the sapphire substrate 110. Thus, the undoped gallium nitride epitaxial layer 130 formed on the buffer layer 120 then forms a stable lattice structure, and the N-type gallium nitride epitaxial layer 140 formed on the undoped gallium nitride epitaxial layer 130 also obtains a stable lattice structure.

The conventional LED chip 100 is also used to produce a thin LED (vertical type) chip, of which the manufacturing method includes first removing the sapphire substrate 110. In the conventional LED chip 100, the buffer layer 120 and the undoped gallium nitride epitaxial layer 130 are still present between the N-type gallium nitride epitaxial layer 140 and the sapphire substrate 110. Therefore, the buffer layer 120 and the undoped gallium nitride epitaxial layer 130 still need to be removed sequentially after the removal of the sapphire substrate 110. Thereby, the manufacturing steps of the thin LED (vertical type) chip increase, thus resulting in long manufacturing time and difficulty in reducing manufacturing costs.

SUMMARY OF THE INVENTION

The present invention provides a manufacturing method of a nitride crystalline film. By applying the manufacturing method, a nitride crystalline film with fine quality is formed without using a buffer layer.

The present invention provides a nitride film having fine quality.

The present invention provides a substrate structure in which no buffer layer is formed. Besides, the substrate structure has a nitride crystalline film with fine quality.

One embodiment of the present invention provides a manufacturing method of a nitride crystalline film including following steps. First, a substrate is provided. A first nitride crystalline film is then formed on the substrate. Next, a patterned mask is formed on the first nitride crystalline film. The patterned mask covers a first part of the first nitride crystalline film and exposes a second part of the first nitride crystalline film. Afterwards, the second part is etched and the first part is maintained. Subsequently, the patterned mask is removed. Thereafter, the first part is etched to form a plurality of nitride crystal nuclei. After that, a second nitride crystalline film is formed on the substrate, and the second nitride crystalline film is made to cover the plurality of nitride crystal nuclei.

In one embodiment of the present invention, a material of the substrate includes at least one of silicon, glass, gallium arsenide (GaAs), gallium nitride (GaN), aluminum gallium arsenide (AlGaAs), gallium phosphide (GaP), silicon carbide (SiC), indium phosphide (InP), boron nitride (BN), zinc oxide (ZnO), aluminum oxide ($Al_2O_3$), lithium aluminum oxide ($LiAlO_2$), or aluminum nitride (AlN).

In one embodiment of the present invention, the aforementioned patterned mask includes a plurality of dispersed nano-balls, and the diameters of the nano-balls range from 100 nm to 50000 nm.

In one embodiment of the present invention, after the etching of the second part, the maintained first part includes a plurality of dispersed nitride rod structures, and the nitride rod structures extend from the substrate and in a direction away from the substrate.

In one embodiment of the present invention, the patterned mask includes a network structure. The network structure has a plurality of dispersed holes, and distances between any two of the adjacent holes range from 100 nm to 50000 nm.

In one embodiment of the present invention, after the etching of the second part, the maintained first part includes a nitride network structure.

In one embodiment of the present invention, the method of etching the second part is a dry etching method.

In one embodiment of the present invention, the method of etching the first part to form the plurality of nitride crystal nuclei is a wet etching method.

A nitride film is provided in another embodiment of the present invention. The nitride film includes a nitride crystalline film and a plurality of nitride crystal nuclei. The nitride crystalline film has a first surface and a second surface opposite to the first surface. The nitride crystal nuclei are disposed dispersedly in the nitride crystalline film. Each of the nitride crystal nuclei has a first end and a second end opposite to the first end, where the first end is disposed at the first surface and the second end is disposed between the first surface and the second surface.

In one embodiment of the present invention, a lattice of the nitride crystalline layer matches lattices of the plurality of nitride crystal nuclei.

In one embodiment of the present invention, the dislocation density of the nitride crystalline film is lower than $2 \times 10^8$ cm$^{-2}$.

A substrate structure is provided in still another embodiment of the present invention. The substrate structure includes a substrate and the aforementioned nitride film. The nitride film is disposed on the substrate, and the first surface of the nitride crystalline film contacts the substrate.

As described above, the manufacturing method of the nitride crystalline film in the embodiment of the present invention applies the method of first forming the nitride crystal nuclei on the substrate to form the nitride crystalline film with low dislocation density on the substrate. Therefore, the manufacturing method of the nitride crystalline film in the embodiment of the present invention does not require formation of a buffer layer between the substrate and the nitride crystalline film. In other words, the manufacturing method of the nitride crystalline film in the embodiment of the present invention can form a nitride crystalline film with low dislocation density without forming the buffer layer. Moreover, as the substrate structure and the nitride film of the embodiment of the present invention have nitride crystal nuclei, the nitride film can obtain fine quality without being formed on the buffer layer.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 2A to 2G are schematic views of a manufacturing method of a nitride crystalline film according to an embodiment of the present invention. The manufacturing method of the nitride crystalline film of the present embodiment includes following steps. Firstly, referring to FIG. 2A, a substrate 210 is provided. In the present embodiment, a material of the substrate 210 is selected from, for instance, at least one of silicon, glass, gallium arsenide (GaAs), gallium nitride (GaN), aluminum gallium arsenide (AlGaAs), gallium phosphide (GaP), silicon carbide (SiC), indium phosphide (InP), boron nitride (BN), zinc oxide (ZnO), aluminum oxide (Al$_2$O$_3$), lithium aluminum oxide (LiAlO$_2$), or aluminum nitride (AlN). A nitride crystalline film 220 is then formed on the substrate 210. In the present embodiment, the method of forming the nitride crystalline film 220 is metal organic chemical vapor deposition (MOCVD), hydride vapor phase epitaxy (HVPE), molecular beam epitaxy (MBE), or any other suitable epitaxy method, for example. Herein, a material of the nitride crystalline film 220 may include gallium nitride (GaN) or other suitable nitride.

Figure 2A:
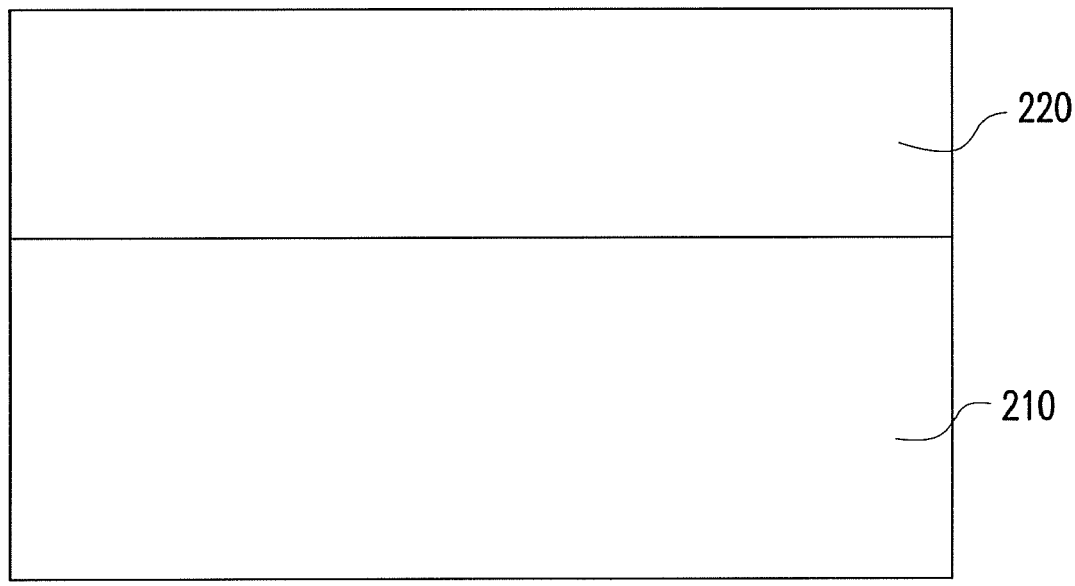
FIGS. 2A to 2G are schematic views illustrating a manufacturing method of a nitride crystalline film according to an embodiment of the present invention.
Figure 2B:
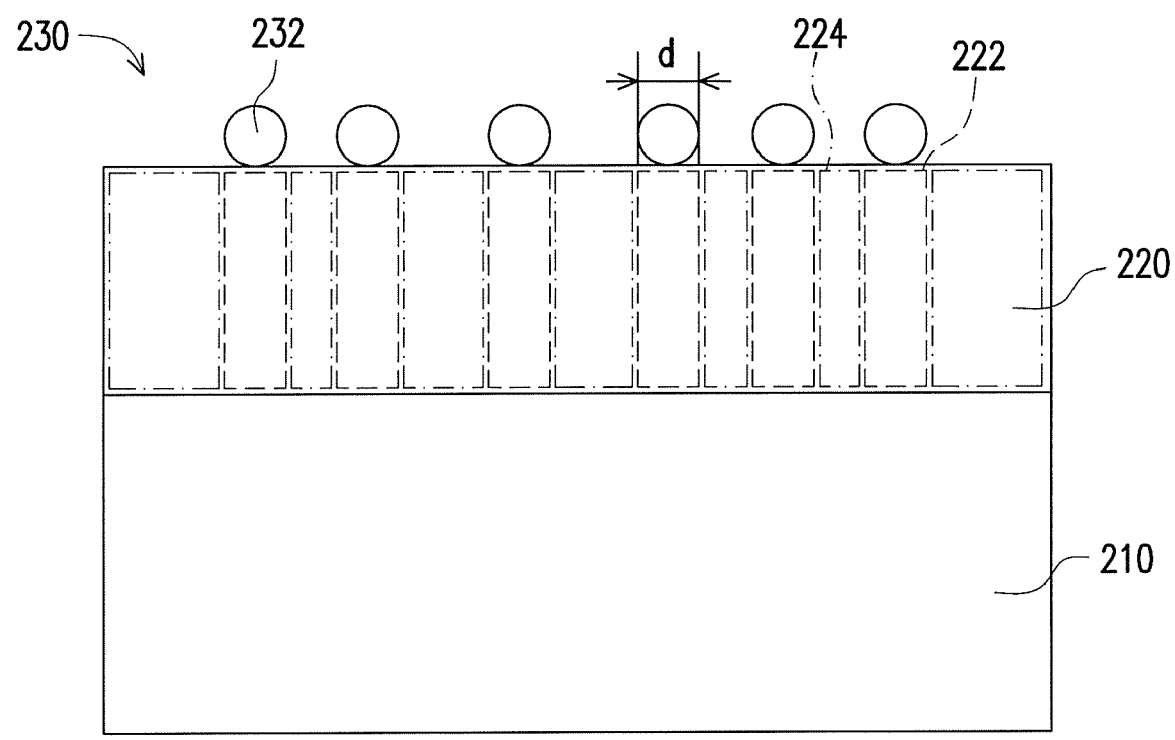
Figure 2C:
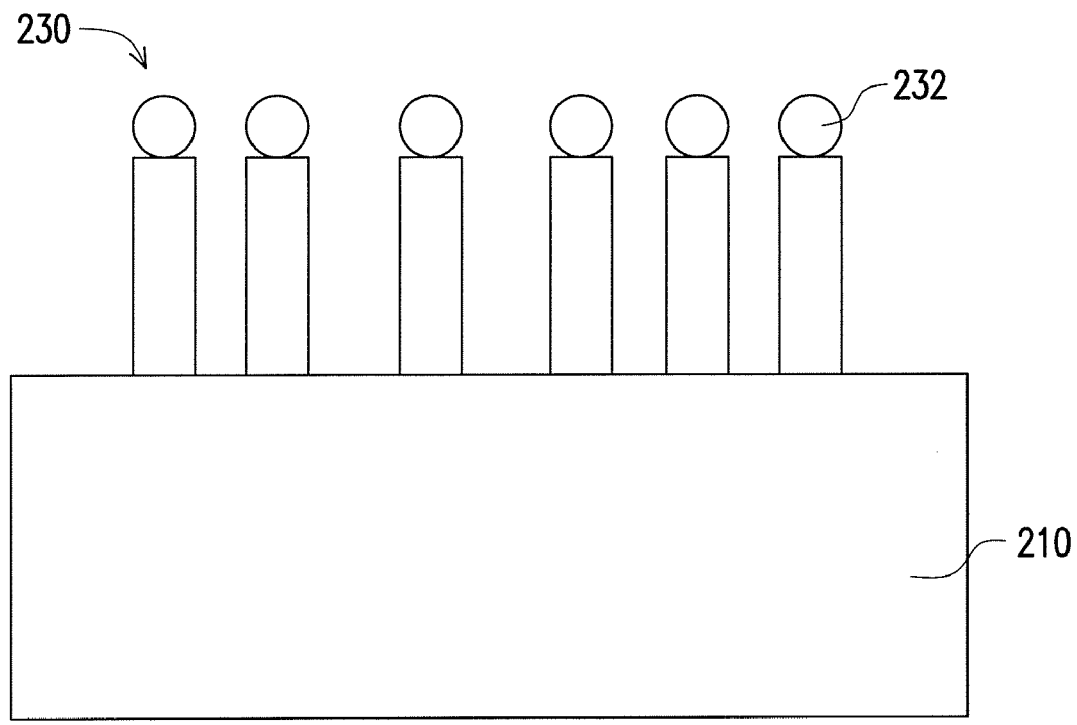

Referring to FIG. 2B, a patterned mask 230 is then formed on the nitride crystalline film 220. In the present embodiment, the patterned mask 230 includes a plurality of dispersed nano-balls 232, and the diameters d of the nano-balls 232 range from 100 nm to 50000 nm. Furthermore, the patterned mask 230 covers a first part 222 of the nitride crystalline film 220 and exposes a second part 224 of the nitride crystalline film 220. Referring to FIG. 2C, subsequently, the second part 224 is etched, and the first part 222 is maintained. In the present embodiment, the maintained first part 222 includes a plurality of dispersed nitride rod structures 226, and the nitride rod structures 226 extend from the substrate 210 and in a direction away from the substrate 210. Moreover, in the present embodiment, the method of etching the second part 224 is a dry etching method, such as an inductive coupling plasma (ICP) etching method, a reactive ion etch (RIE) method, or any other suitable etching method.

Figure 2D:
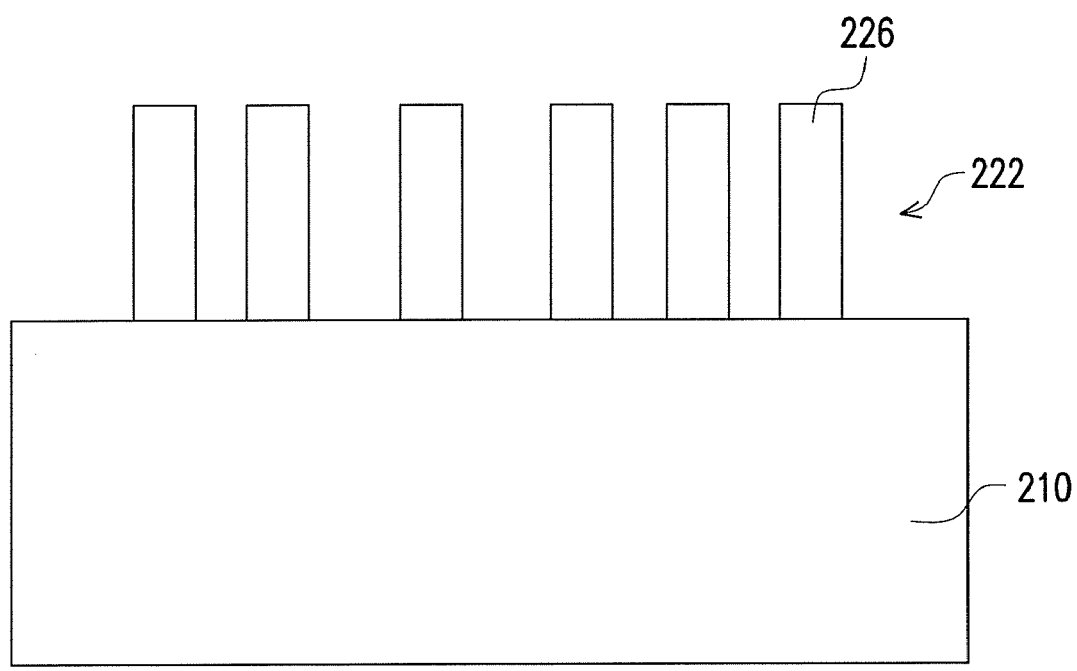
Figure 2E:
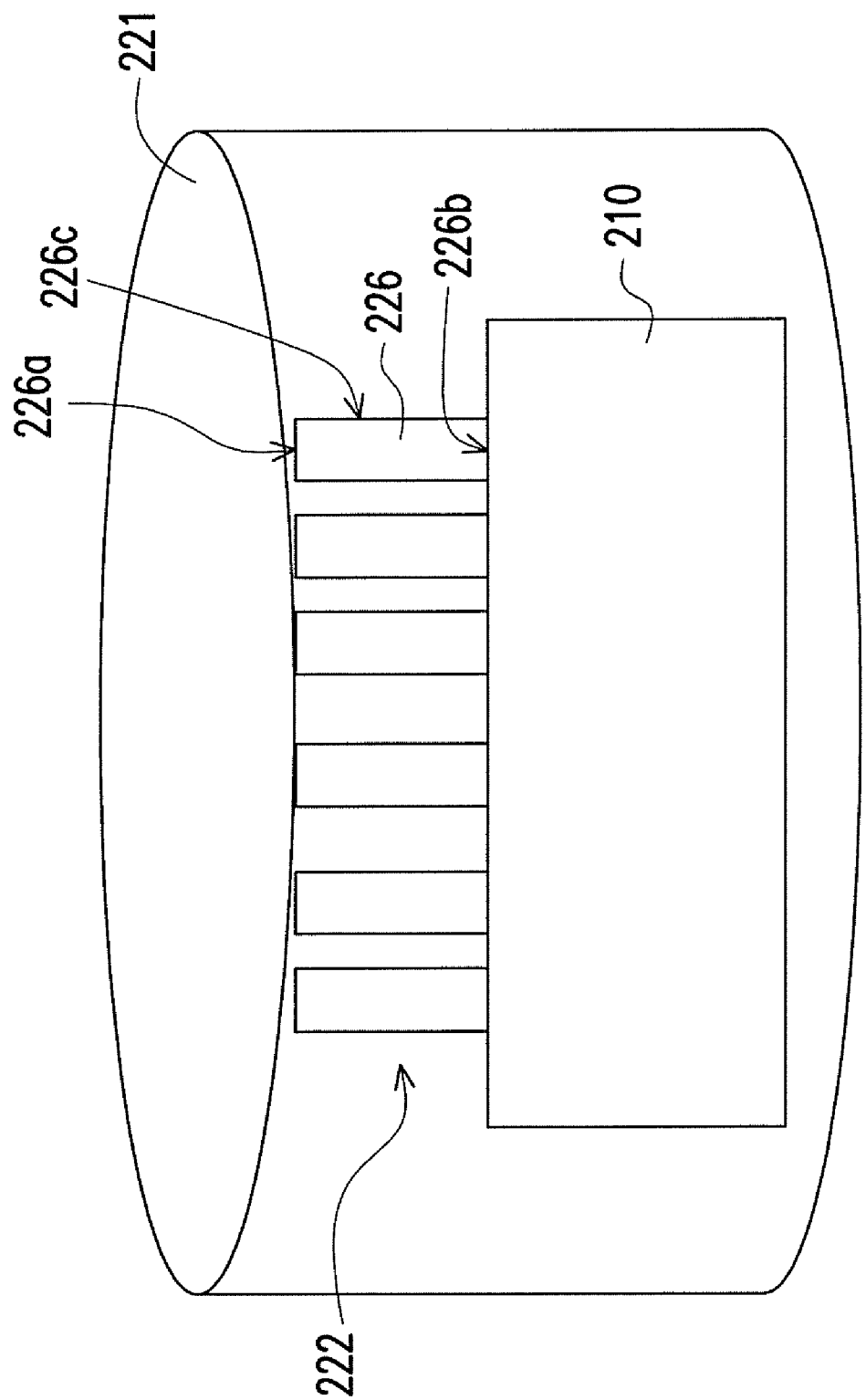

Referring to FIG. 2D, next, the patterned mask 230 is removed. Referring to FIG. 2E, the first part 222 is then etched to form a plurality of nitride crystal nuclei 228. In the present embodiment, the method of etching the first part 222 to form the plurality of nitride crystal nuclei 228 is a wet etching method. In the wet etching method, for example, the first part 222 is soaked in an etching solution 221 that can etch the nitride crystalline film 220. Moreover, the etching solution 221 is sulfuric acid, hydrochloric acid, phosphoric acid, other acidic solutions, potassium hydroxide, sodium hydroxide, other basic solutions, or other etching solutions, for instance. Specifically, after the second part 224 is etched, side walls 226c of the remaining nitride rod structures 226 (i.e., the first part 222) produce dangling bonds. In addition, in the present embodiment, the material of the nitride rod structures 226 is, for example, gallium nitride. A base 226b where the nitride rod structures 226 and the substrate 210 connect is a nitrogen face (N face), while a top 226a of the nitride rod structures 226 that is opposite to the base 226b is a gallium face (Ga face). Further, the etching solution 221 starts to etch the nitride rod structures 226 from the dangling bonds or starts to etch the nitride rod structures 226 along the N face.

Figure 2F:
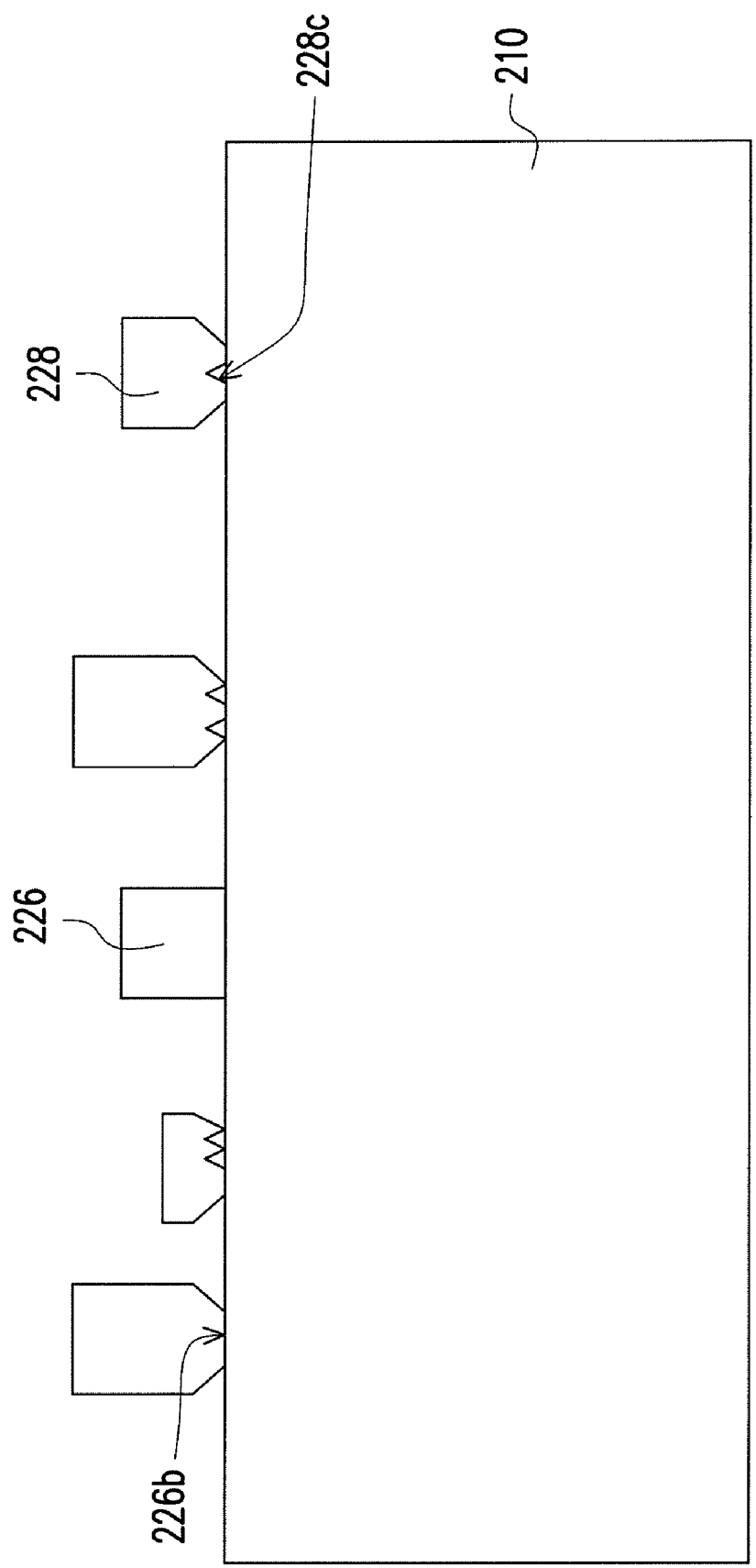

Referring to FIG. 2F, as described above, when the etching solution 221 etches the nitride rod structures 226 from the dangling bonds located on the side walls 226c, the nitride rod structures 226 are cut from the dangling bonds. In other words, an upper portion of the nitride rod structures 226 disposed above the dangling bonds are removed while a bottom portion disposed below the dangling bonds are maintained. On the other hand, in the present embodiment, when the etching solution 221 etches the nitride rod structures 226 along the N face, the etching solution 221 then etches along the N face of the nitride crystals. Therefore, the nitride rod structures 226 form a plurality of hexagonal inverted pyramids on the surface facing the substrate 210. In addition, lattice faces 228c of the hexagonal inverted pyramids are {10$\overline{1}\overline{1}$}. After an entire entire N face of one of the nitride rod structures 226 is etched by the etching solution 221, this nitride rod structure 226 is then entirely removed from the substrate 210. After the nitride rod structure 226 on the substrate 210 is cut, the remaining nitride rod structure 226 subsequently forms the nitride crystal nucleus 228.

Figure 2G:
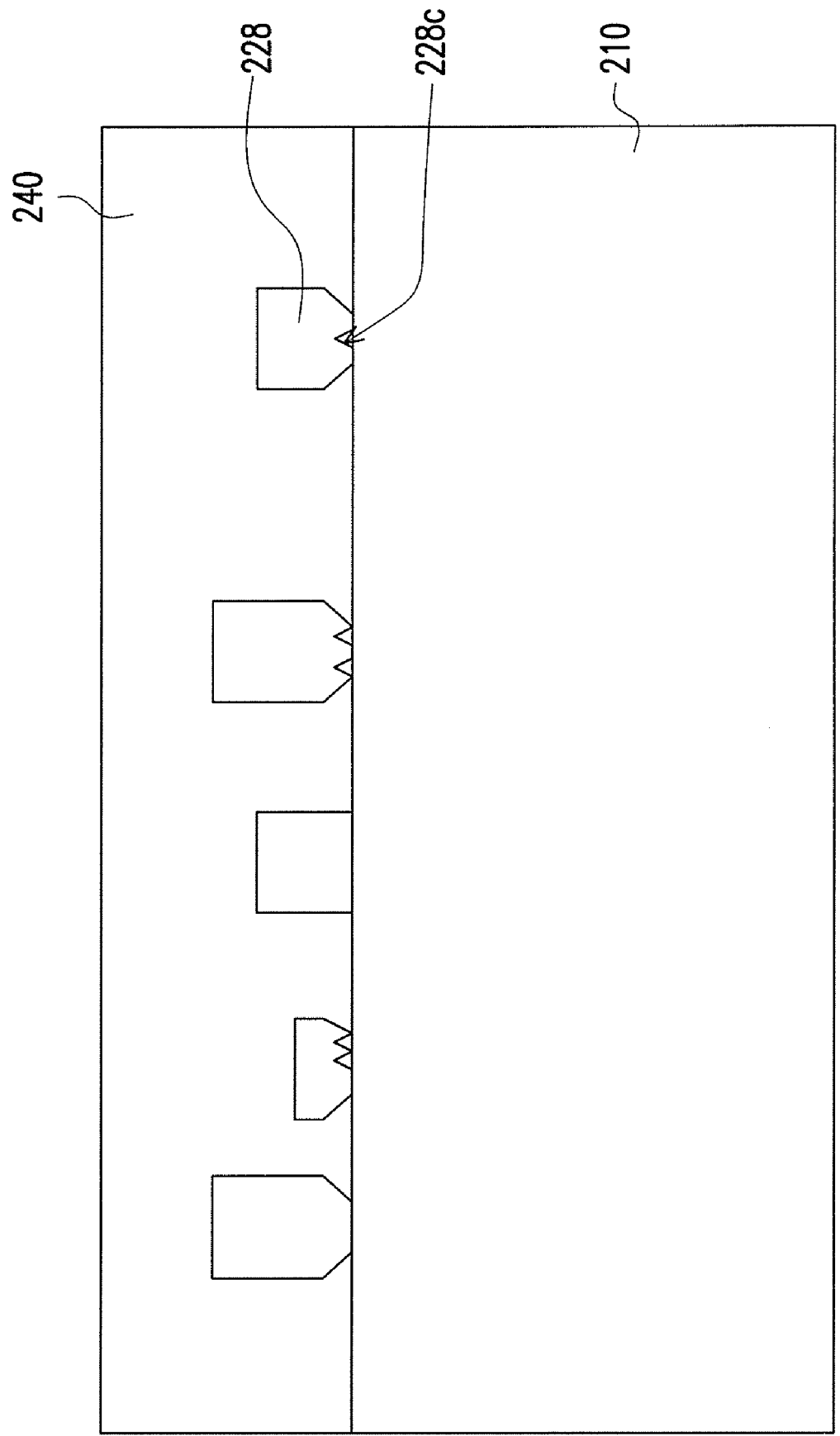

Referring to FIG. 2G, afterwards, a nitride crystalline film 240 is formed on the substrate 210, and the nitride crystalline film 240 is made to cover the nitride crystal nuclei 228. In the present embodiment, the material of the nitride crystalline film 240 and the material of the nitride crystalline film 220 are nitride-based materials. In other words, the material of the nitride crystalline film 240 and the material of the nitride crystal nuclei 228 may be substantially identical. When the nitride crystalline film 240 is formed on the substrate 210, crystallization starts on the nitride crystal nuclei 228. Since the material of the nitride crystalline film 240 and the material of the nitride crystal nuclei 228 are substantially identical, their lattices match. Consequently, the nitride crystalline film 240 that starts being crystallized from the nitride crystal nuclei 228 obtains a favorable lattice structure. Thus, in the present embodiment, the nitride crystalline film 240 with fine quality can be formed on the substrate 210 without forming a buffer layer in advance. As the experimental result shows, the dislocation density of the nitride crystalline film 240 is lower than $2\times10^8$ cm$^{-2}$. Therefore, it is evidenced the nitride crystalline film 240 has fine quality.

Figure 3A:
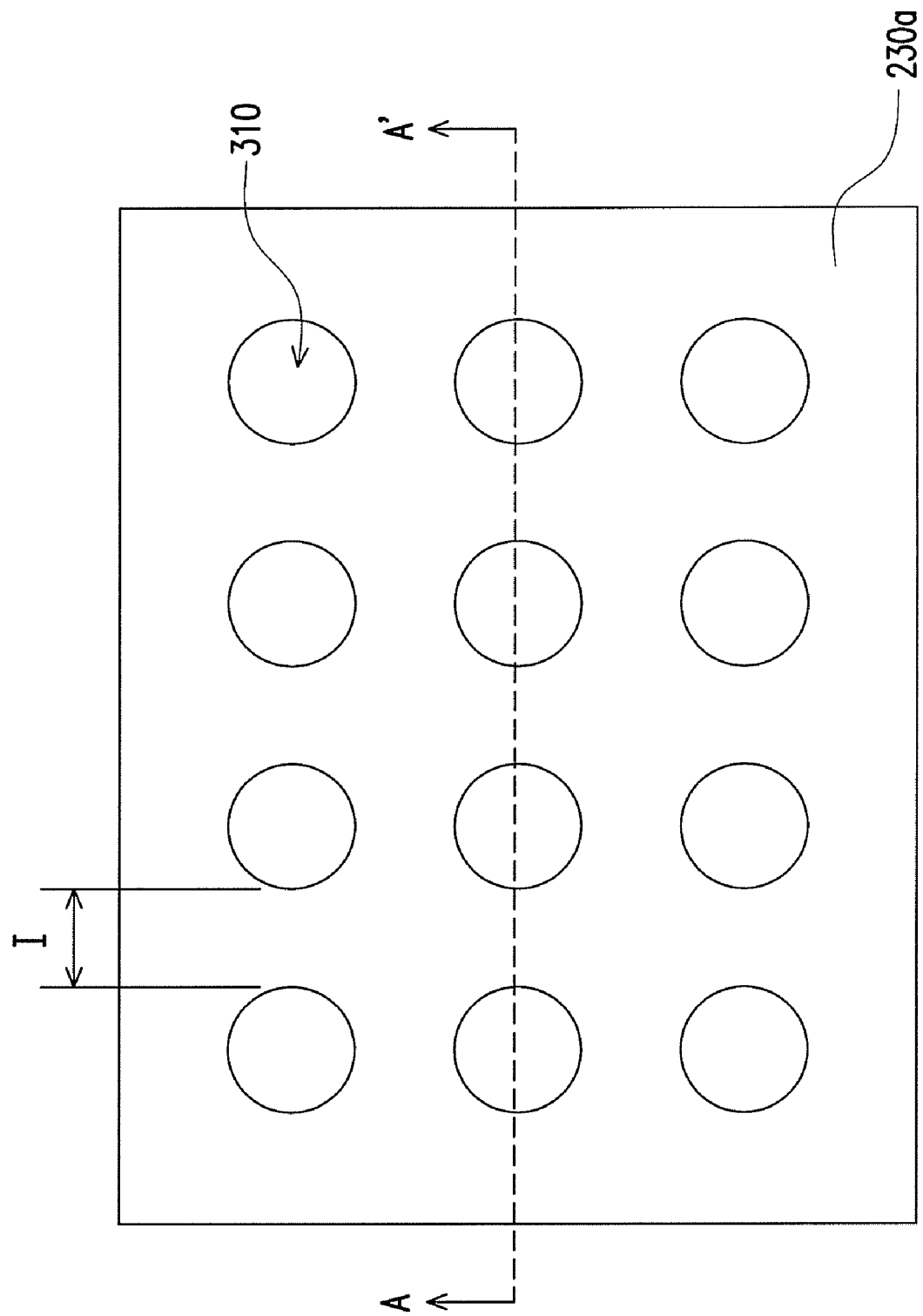
FIGS. 3A and 3C show two steps of a manufacturing method of a nitride crystalline film according to another embodiment of the present invention.
Figure 3B:
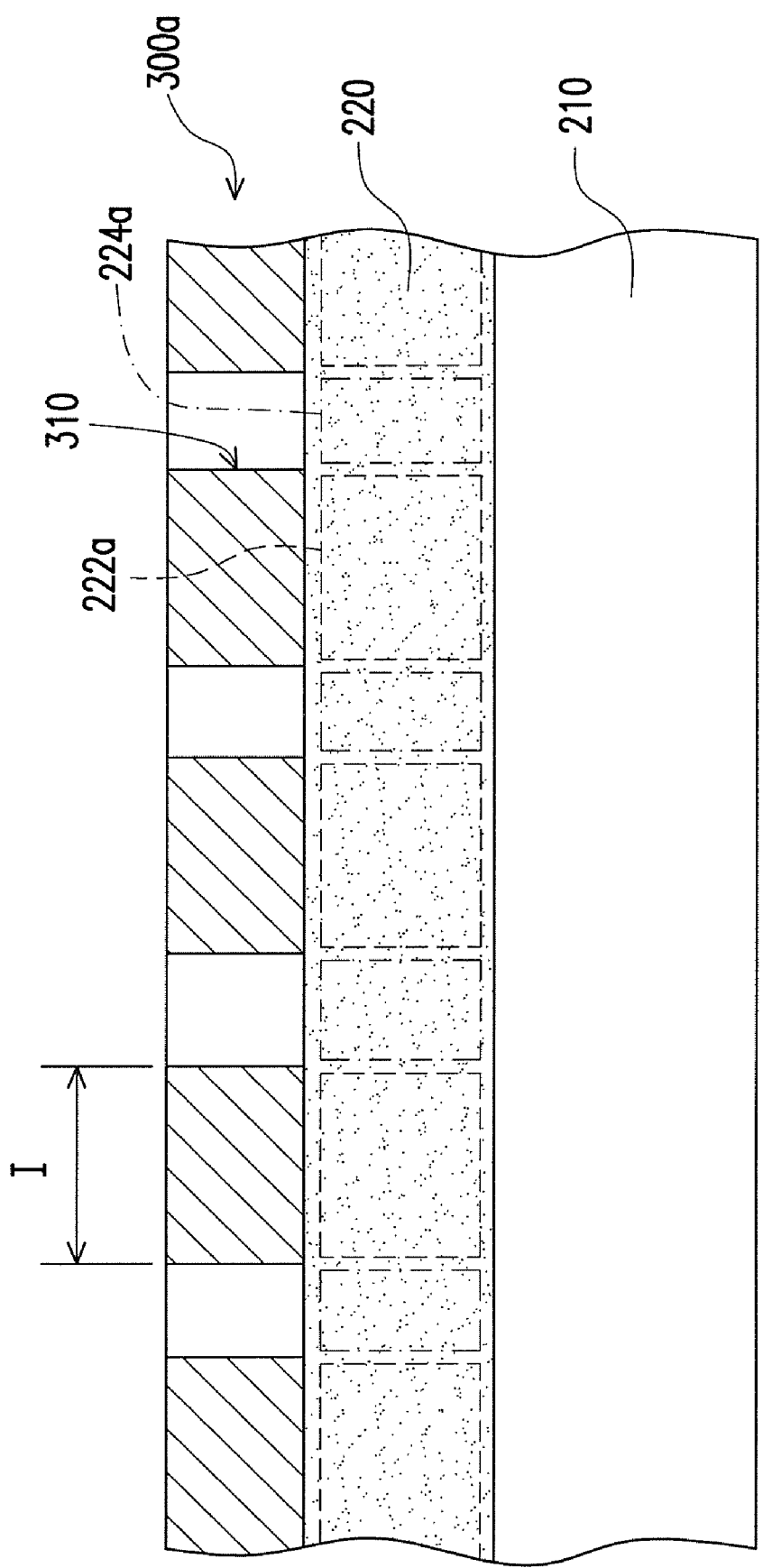
FIG. 3B is a schematic cross-sectional view taken along line A-A' depicted in FIG. 3A.

FIG. 3A shows one of the steps of a manufacturing method of a nitride crystalline film according to another embodiment of the present invention. FIG. 3B is a schematic cross-sectional view of the structure of FIG. 3A taken along line A-A'. Referring to FIG. 3A and FIG. 3B, the manufacturing method of the nitride crystalline film in the present embodiment and the manufacturing method of the nitride crystalline film shown in FIGS. 2A to 2G are similar, while the difference between the two methods is described as follows. In the manufacturing method of the nitride crystalline film of the present embodiment, a patterned mask 230a is a network structure, for example. The network structure 230a has a plurality of dispersed holes 310, and distances I between any two of the adjacent holes range from 100 nm to 50000 nm.

Figure 3C:
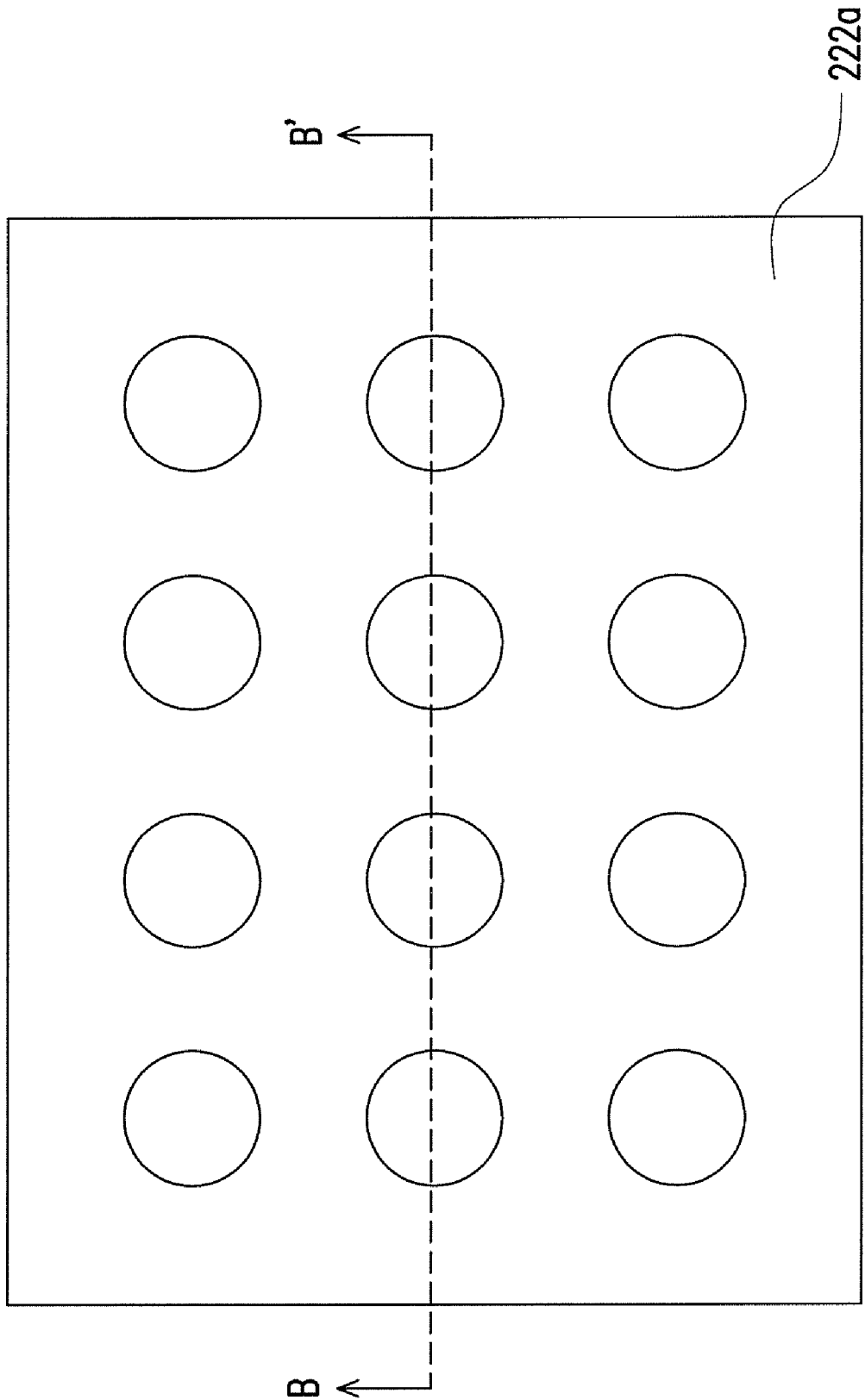
Figure 3D:
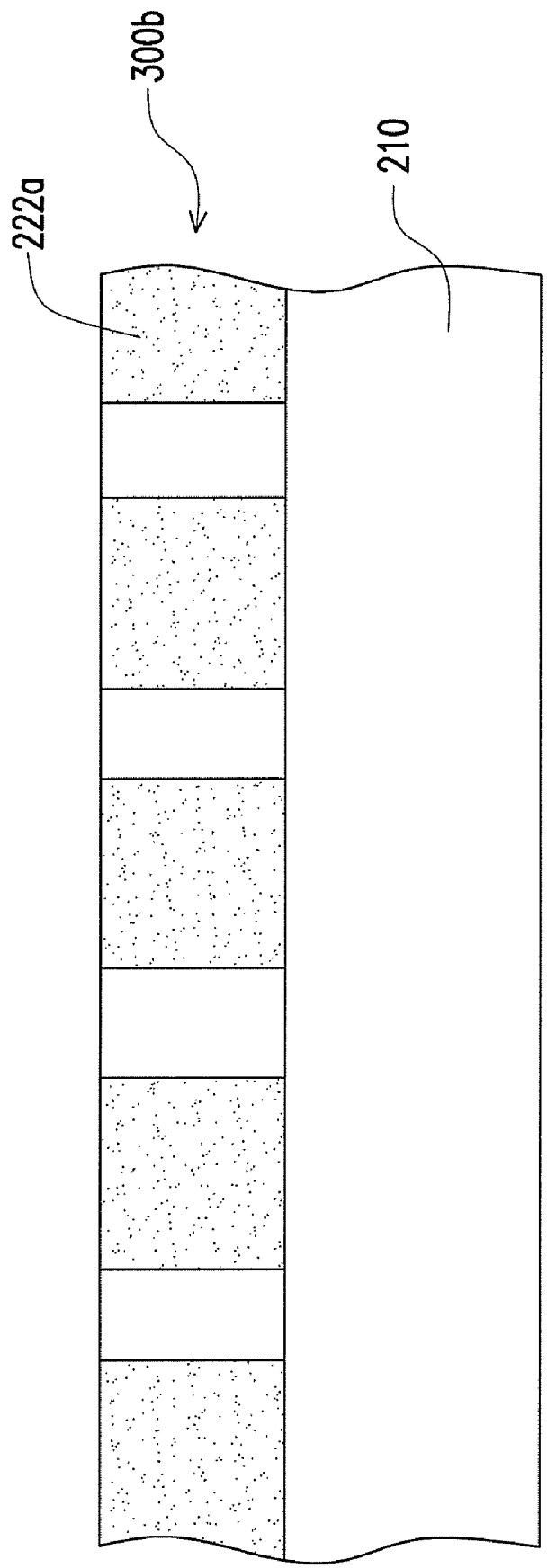
FIG. 3D is a schematic cross-sectional view taken along line B-B' depicted in FIG. 3C.

FIG. 3C shows another step of the manufacturing method of the nitride crystalline film of FIG. 3A. FIG. 3D is a schematic cross-sectional view of the structure of FIG. 3C taken along line B-B'. Referring to FIG. 3C and FIG. 3D, in the manufacturing method of the nitride crystalline film of the present embodiment, after the etching of the second part 224a (as shown in FIG. 3B), the maintained first part 222a forms a nitride network structure. The manufacturing method of the nitride crystalline film of the present embodiment has similar advantages and functions to those of the manufacturing method of the nitride crystalline film shown in FIG. 2A to FIG. 2G, and thus is not repeated herein.

Figure 4:
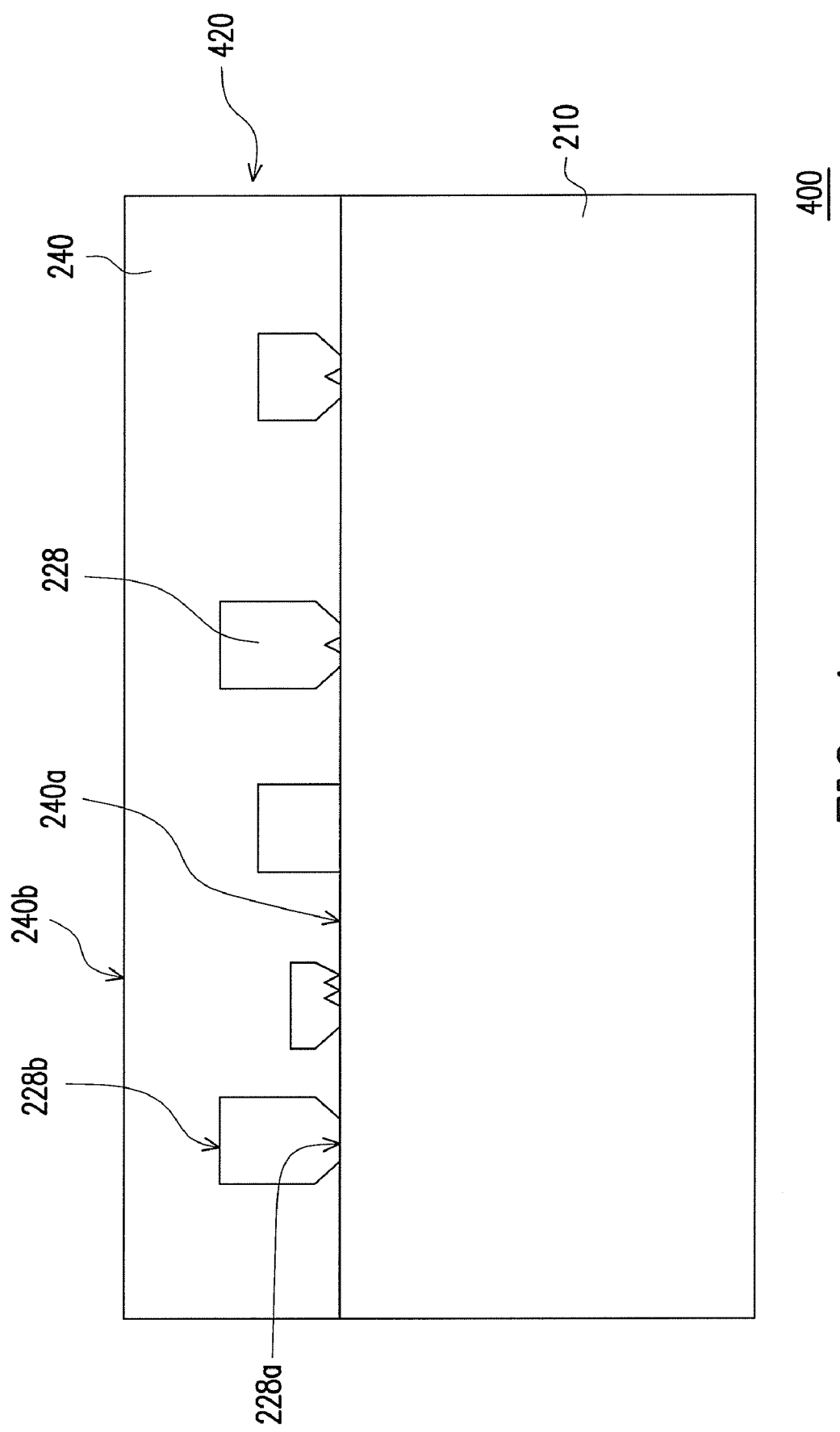
FIG. 4 is a schematic view of a substrate structure according to an embodiment of the present invention.

FIG. 4 is a schematic cross-sectional view of a substrate structure according to an embodiment of the present invention. Referring to FIG. 4, a substrate structure 400 of the present embodiment is identical to the structure shown in FIG. 2G. The substrate structure 400 of the present embodiment includes the aforementioned substrate 210 and a nitride film 420. The nitride film 420 is disposed on the substrate 210. The nitride film 420 includes the above nitride crystalline film 240 and the above nitride crystal nuclei 228. The nitride crystalline film 240 has a first surface 240a and a second surface 240b opposite to the first surface 240a, wherein the first surface 240a of the nitride crystalline film 240 contacts the substrate 210. The plurality of nitride crystal nuclei 228 is disposed dispersedly in the nitride crystalline film 240. Each of the nitride crystal nuclei has a first end 228a and a second end 228b opposite the first end 228a. The first end 228a is disposed on the first surface 240a and the second end 228b is disposed between the first surface 240a and the second surface 240b. In the present embodiment, the lattice of the nitride crystalline film 240 matches the lattices of the nitride crystal nuclei 228, and the materials of the nitride crystalline film 240 and the nitride crystal nuclei 228 are substantially identical. Further, the dislocation density of the nitride crystalline film 240 is lower than $2\times10^8$ cm$^{-2}$. Since in the present embodiment, the lattice of the nitride crystalline film 240 matches the lattices of the nitride crystal nuclei 228, and the materials of the nitride crystalline film 240 and the nitride crystal nuclei 228 are substantially identical, the substrate structure 400 can still obtain the nitride crystalline film 240 with fine crystal quality even though the buffer layer is absent between the substrate 210 and the nitride crystalline film 240.

Figure 5:
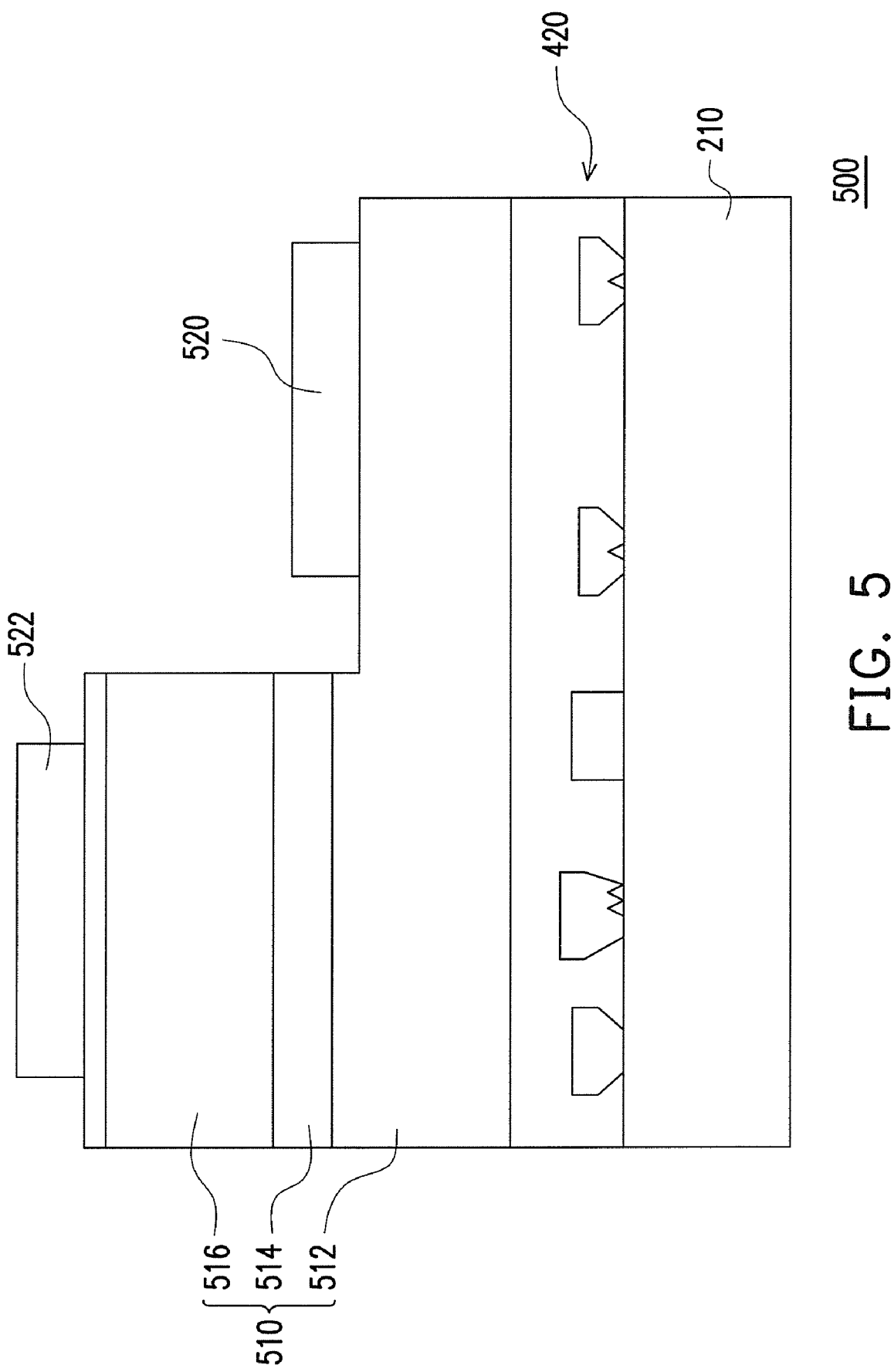
FIG. 5 is a schematic view of a light emitting diode (LED) according to an embodiment of the present invention.

FIG. 5 shows the application of the substrate structure of FIG. 4 in an LED chip. In the present embodiment, the LED chip 500 includes the aforementioned substrate structure 400, a semiconductor layer 510, and two electrodes 520 and 522. The semiconductor layer 510 is formed on the substrate structure 400, where the semiconductor 510 includes a first doped semiconductor layer 512, a light emitting layer 514, and a second doped semiconductor layer 516. Herein, the first doped semiconductor layer 512 is disposed on the substrate structure 400, and the light emitting layer 514 is disposed on a portion of the first doped semiconductor layer 512. Additionally, the second doped semiconductor layer 516 is disposed on the light emitting layer 514, and the electrode 520 is electrically connected to the first doped semiconductor layer 512 that is not covered by the light emitting layer 514. On the other hand, the electrode 522 is electrically connected to the second doped semiconductor layer 516. In the present embodiment, when the first doped semiconductor layer 512 is a P-type semiconductor layer, the second doped semiconductor layer 516 is an N-type semiconductor layer. However, in other embodiments, the first doped semiconductor layer 512 can also be an N-type semiconductor layer, while the second doped semiconductor layer 516 is a P-type semiconductor layer. As the substrate structure 400 has a lower dislocation density, the crystals of the semiconductor layer 510 have favorable quality and fewer defects. Furthermore, the lattice structures of the first doped semiconductor layer 512 that is disposed on the substrate structure 400 are similar to the lattice structures of the nitride film 420. Since the crystal quality of the semiconductor 510 affects the light emitting efficiency and the lifetime of the LED chip 500, and the nitride crystalline film 240 on the substrate structure 400 of the present embodiment has favorable crystal quality and fewer defects, the LED chip 500 has favorable light emitting efficiency and long lifetime.

Figure 1:
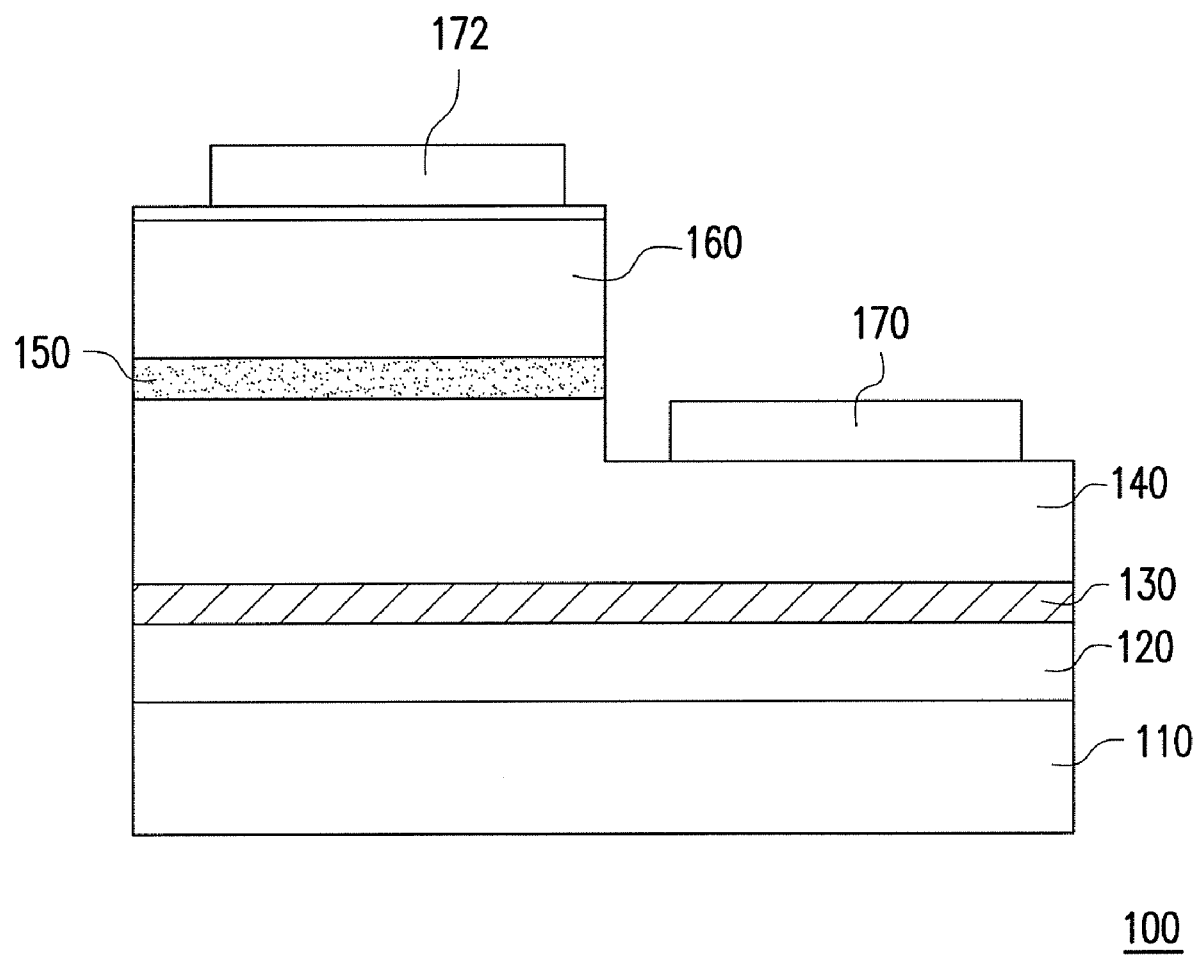
FIG. 1 is a schematic view of a conventional LED chip.

In the present embodiment, the aforementioned LED chip 500 is also applied for fabricating a thin (vertical type) LED. Compared to the conventional process of manufacturing the thin (vertical type) LED chip that requires removal of the substrate 110, the buffer layer 120 and the undoped gallium nitride epitaxial layer 130 (as shown in FIG. 1), the LED chip 500 of the present embodiment does not possess the buffer layer 120. Thus, the step of removing the buffer layer 120 and the undoped gallium nitride epitaxial layer 130 is omitted, and only the substrate 210 is needed to be removed. As a consequence, the substrate structure 400 of the present embodiment is suitable for manufacturing the thin (vertical type) LED chip to reduce the manufacturing costs and manufacturing time of the thin (vertical type) LED chips.

In summary, according to the embodiments of the present invention, the manufacturing method of the nitride crystalline film can directly form a nitride crystalline film with fine crystal quality on the substrate without the need to form the buffer layer in the manufacturing process. The manufacturing method described above can form the nitride film of the embodiments of the present invention. Herein, the nitride film includes the nitride crystal nuclei and the nitride crystalline film, and the nitride crystal nuclei have fine crystal quality. In addition, according to the aforementioned manufacturing method, the substrate structure described in the embodiment of the present invention can be further formed. Since the substrate structure does not have the buffer layer, in the manufacturing of the thin (vertical type) LED chip, the steps and time for removing the buffer layer and the undoped gallium nitride epitaxial layer can be saved. The substrate structure is therefore suitable for being applied to fabrication of the thin (vertical type) LED chip, and the manufacturing costs can also be reduced.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A manufacturing method of a nitride crystalline film, comprising:
   providing a substrate;
   forming a first nitride crystalline film on the substrate;
   forming a patterned mask on the first nitride crystalline film, wherein the patterned mask covers a first part of the first nitride crystalline film and exposes a second part of the first nitride crystalline film;
   etching the second part and maintaining the first part;
   removing the patterned mask;
   etching the first part to form a plurality of nitride crystal nuclei; and
   forming a second nitride crystalline film on the substrate, and making the second nitride crystalline film completely fill up voids between the plurality of nitride crystal nuclei and cover the plurality of nitride crystal nuclei.

2. The manufacturing method of the nitride crystalline film of claim 1, wherein a material of the substrate comprises at least one of silicon, glass, gallium arsenide, gallium nitride, aluminum gallium arsenide, gallium phosphide, silicon carbide, indium phosphide, boron nitride, zinc oxide, aluminum oxide, lithium aluminum oxide, and aluminum nitride.

3. The manufacturing method of the nitride crystalline film of claim 1, wherein the patterned mask comprises a plurality of dispersed nano-balls, and the diameters of the nano-balls range from 100 nm to 50000 nm.

4. The manufacturing method of the nitride crystalline film of claim 3, wherein after the etching of the second part, the maintained first part comprises a plurality of dispersed nitride rod structures, and the nitride rod structures extend from the substrate and in a direction away from the substrate.

5. The manufacturing method of the nitride crystalline film of claim 1, wherein the patterned mask comprises a network structure having a plurality of dispersed holes, and distances between any two of the adjacent holes range from 100 nm to 50000 nm.

6. The manufacturing method of the nitride crystalline film of claim 5, wherein after the etching of the second part, the maintained first part comprises a nitride network structure.

7. The manufacturing method of the nitride crystalline film of claim 1, wherein the method of etching the second part is a dry etching method.

8. The manufacturing method of the nitride crystalline film of claim 1, wherein the method of etching the first part to form the plurality of nitride crystal nuclei is a wet etching method.

9. The manufacturing method of the nitride crystalline film of claim 1, wherein the plurality of nitride crystal nuclei has hexagonal inverted pyramids, and lattice faces of the hexagonal inverted pyramids are $\{10\bar{1}\bar{1}\}$.

* * * * *